United States Patent
Yen et al.

(10) Patent No.: US 7,177,331 B2
(45) Date of Patent: Feb. 13, 2007

(54) LASER DIODE MODULE WITH A BUILT-IN HIGH-FREQUENCY MODULATION IC

(75) Inventors: Hsien-Cheng Yen, Taoyuan County (TW); Chun-Ting Lin, Taoyuan County (TW)

(73) Assignee: Arima Optoelectronics Corp., Taoyuan County (TW)

( * ) Notice: Subject to any disclaimer, the term of this patent is extended or adjusted under 35 U.S.C. 154(b) by 283 days.

(21) Appl. No.: 10/998,733

(22) Filed: Nov. 30, 2004

(65) Prior Publication Data
US 2006/0114950 A1    Jun. 1, 2006

(51) Int. Cl.
*H01S 3/10*   (2006.01)
(52) U.S. Cl. .................. 372/28; 372/36; 372/38.07; 372/38.08
(58) Field of Classification Search ................. 372/28, 372/36, 38.07, 38.08
See application file for complete search history.

(56) References Cited

U.S. PATENT DOCUMENTS 6,011,768 A * 1/2000 Taguchi ............. 369/116

FOREIGN PATENT DOCUMENTS

| JP | 04-352378 | * | 7/1992 |
| JP | 05-082896 | * | 2/1993 |
| JP | 05-167200 | * | 2/1993 |

* cited by examiner

*Primary Examiner*—Minsun Oh Harvey
*Assistant Examiner*—Delma R. Flores Ruiz
(74) *Attorney, Agent, or Firm*—Rosenberg, Klein & Lee

(57) ABSTRACT

A laser diode module with a built-in high-frequency modulation IC used to remove the reflected noise generated as the laser beam reads the signal to be played back and directly packaged within a metal cap. The high-frequency modulation IC creates an electrical connection through wire bonding with several connection legs and the laser diode module. The packaged laser diode module has four connection legs. Two of these connection legs act as a positive and a negative terminal for supplying power to the built-in high-frequency modulation IC. The other two connection legs are electrically connected to an external automatic power control (APC) circuit and act as the positive terminal of the laser diode and the photo diode, respectively. In this way, the inconvenience of externally attaching a high-frequency current producing circuit board can be avoided, the productivity can be enhanced and the radiation of electromagnetic interference (EMI) can be reduced.

14 Claims, 7 Drawing Sheets

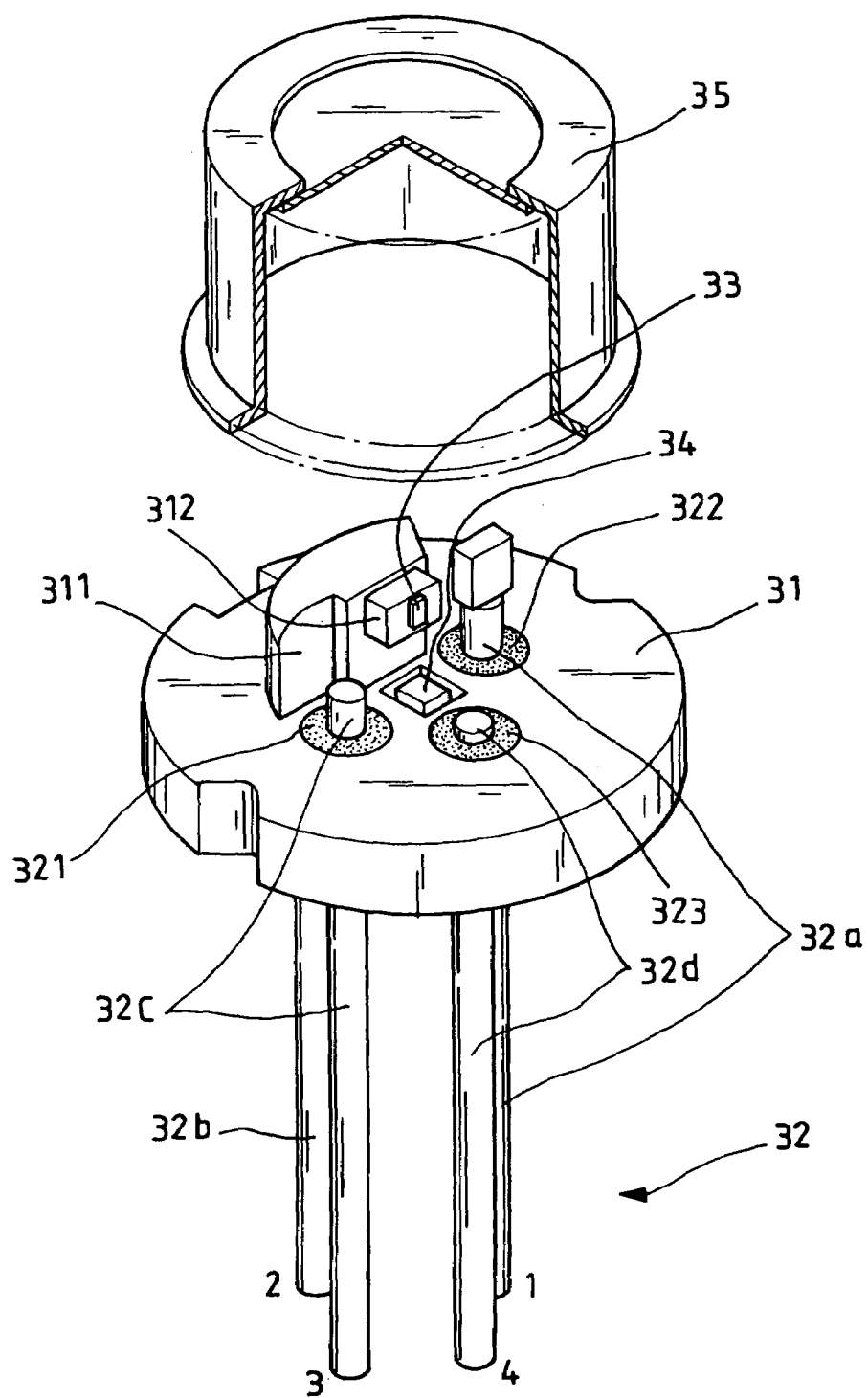
F I G. 2

LASER DIODE MODULE WITH A BUILT-IN HIGH-FREQUENCY MODULATION IC

BACKGROUND OF THE INVENTION

1. Field of the Invention

The invention relates to a laser diode module with a built-in high-frequency modulation IC (abbr. for integrated circuit), and more particularly to a laser diode module that is used to remove the reflected noise generated as the laser beam reads the signal to be played back and that is directly packaged within a metal cap.

2. Description of the Related Art

Among the important components inside a CD-ROM and DVD, the optical reader, or so called optical pickup apparatus, which reads the signals stored on the CD, is made up of several optical components, including the laser diode (LD), objective lens, hologram, and photo diode (PD).

When the laser diode acts as the optical pickup apparatus, then the problem of the reflected noise will occur. When an optical beam from the laser diode is released onto the diskette, some of the reflected light from the diskette's surface will go back to the LD, creating the fuzzy signal phenomenon. Since the laser diode vibrates on a single mode, therefore, when there is light reflected back, it will produce mode hopping, and since the output of optical volume will have massive changes, hence it will produce the reflected noise.

Therefore, in the prior technology, in order to reduce the reflected noise, a high-frequency electric current is used to produce electric circuit. Meanwhile, multimodes are used to make LDs vibrate so that even though it will create mode hopping, it will not alter the output of optical volume. It is already known that 200 MHz and above frequencies will overlap with frequencies of 20~30 mA and above as well as the LD's electric current control, which is set as the driving current. Multimodes are used to vibrate the laser diode to reduce the reflected noise. These patents have already been applied by TOSHIBA, patent number 89111889, applied in Taiwan on Jun. 16, 2000. Patents in Japan, number 11-297014, applied on Oct. 19, 1999, and number 9-49431, applied on Mar. 4, 1997, and the U.S. Pat. No. 6,489,600, can be found.

However, in the prior technology (see FIG. 1), the laser diode chip is first placed onto the heat sink (11). In order to prevent the exposed chip from being damaged, a metal cap (12) must be sealed on top of it and dry gas with very low dew point pumped inside. The diameter of the final laser diode module (10) sealed packaging is 5.6 mm while the legs of several terminals (13) extend from the bottom of the heat sink (11). The electric circuit produced by the high-frequency electric current (21) is linked to the sealed laser diode modules (10) through a printed circuit board (PCB) (20). However, this type of structure still has the following drawbacks in the manufacturing and usage of optical pickup apparatus:

1. When manufacturing the optical pickup apparatus, a circuit board (20) for producing the high-frequency electric current must be externally attached. This not only increases the inconvenience during manufacturing, but also relies on manual adjustment of the optical output, which in turn affects production efficiency and increases manufacturing costs as well.
2. By externally attaching the circuit board (20) for producing high-frequency electric current onto the laser diode modules (10), the size of the entire device cannot become any smaller. This makes it difficult to design CD devices that demand small size and lightweight, hence it cannot be applied to some special products that require smaller sizes.
3. In addition, when the externally attached circuit (21) for producing high-frequency electric current is activated, it will result in a great deal of electromagnetic interference (EMI).

SUMMARY OF THE INVENTION

The main object of the invention is to provide a type of a laser diode module with a built-in high-frequency modulation IC, which uses existing 5.6 mm diameter or smaller sealed packaging, to remove the reflected noise generated by the laser diode. A circuit for producing high-frequency current is integrated to be the high-frequency modulation IC. At the same time, directly seal and package the HFMIC inside the metal cap to save the hassle of externally attaching a circuit board during assembly of CD devices. It can also reduce manual adjustments being made, which will greatly enhance productivity and usage convenience, simplify module designing, and bring down manufacturing costs.

Another object of the invention is to reduce the external space by modularizing laser diode of the optical pickup apparatus. This will have positive benefits on bringing down the weight and thickness of CD devices.

A further object of the invention is to reduce the electromagnetic interference (EMI) by directly packaging the high-frequency modulation IC und having the metal cap's shielding.

BRIEF DESCRIPTION OF THE DRAWINGS

The accomplishment of this and other objects of the invention will become apparent from the following descriptions and its accompanying drawings of which:

FIG. 2 is an exploded view of the present invention;

DETAILED DESCRIPTION OF THE PREFERRED EMBODIMENT

Figure 1:
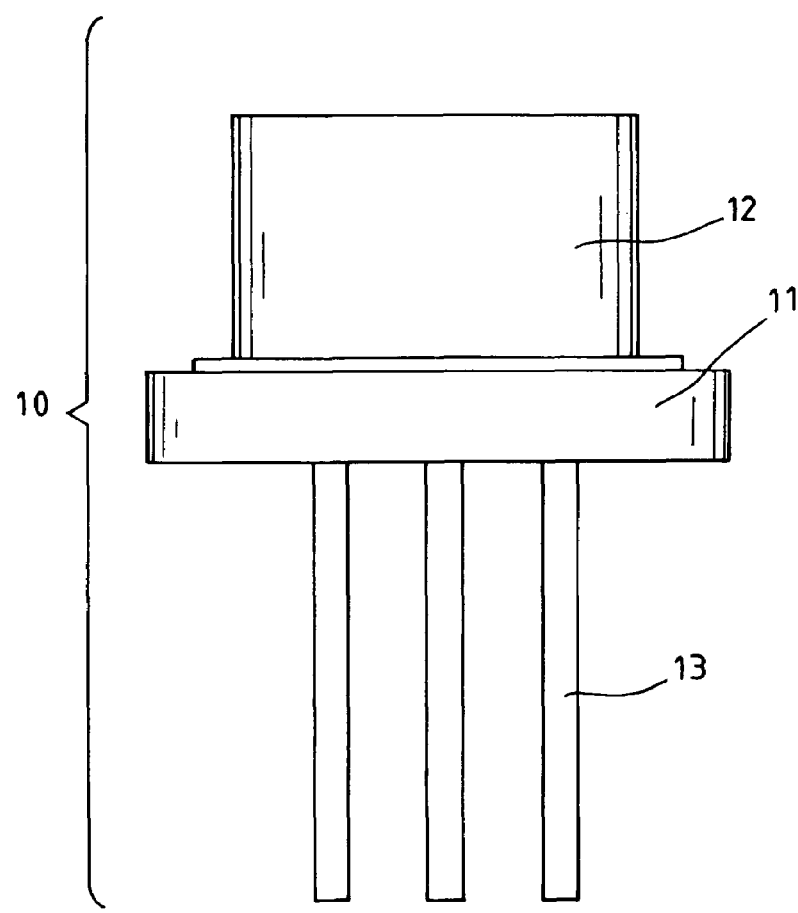
FIG. 1 is a schematic drawing of a conventional laser diode externally connected with a circuit for producing high-frequency current.
Figure 1:
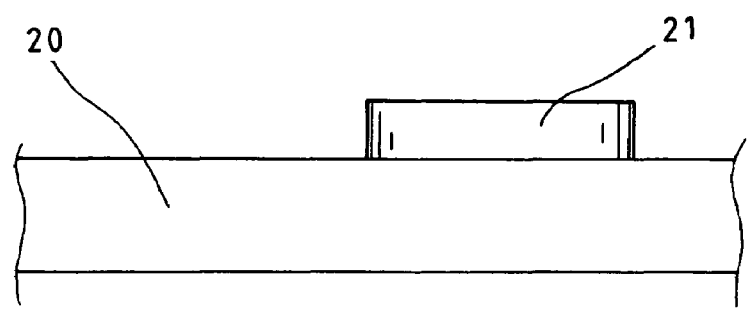

First, please refer to FIG. 2. A laser diode module with a built-in high-frequency modulation IC in accordance with the invention include: a heat sink 31, with several legs 32 protruding from its back cover; a mount 311, which sticks out from the surface of the heat sink 31; a submount 312, which is set up on the mount 311. FIG. 2 shows the inner layer, which is for installing a laser diode 33. A photo diode 34 is mounted upon the surface of the heat sink 31, and across from the laser diode 33, while a metal cap 35 locks in on top of the heat sink 31. This is the fundamental structure for the laser diode and photo diode modules 30. However, these elements are already developed in the prior art, and no further description will be given hereinafter.

The biggest feature of the invention is that a high-frequency producing circuit for reducing the reflected noise generated by the laser diode is integrated to be a high-frequency modulation IC (HFMIC) 36 that is directly packaged within the sealed metal cap 35, i.e. before the metal cap 35 is joined on top of the heat sink 31, the HFMIC 36 is already built-in. As the diameter of the laser diode modules 30 is 5.6 mm, while the length of the HFMIC is within 2.9 mm, width between 1.6~2.8 mm, and depth about 1 mm. Therefore, it can be built in an appropriate spot inside the metal cap 35, then form an electric connection through its wire bond and reserved connection legs 32 and laser diode 33.

During the testing process of the invention, it was discovered that a better location for its built-in HFMIC 36 should be placed above the mount 311. There is enough space in this place, and it will not block off the optical output of the laser diode and the optical detection of the photo diode. However, the mount 311, heat sink 31, and second connection leg 32b form an electrical connection, which are the GND's negative terminal power source. However, the HFMIC 36 has more connection points, hence an insulation layer 361 needs to be placed between it and the mount 312, so that the HFMIC 36 and the mount 311 are insulated each other.

Figure 7:
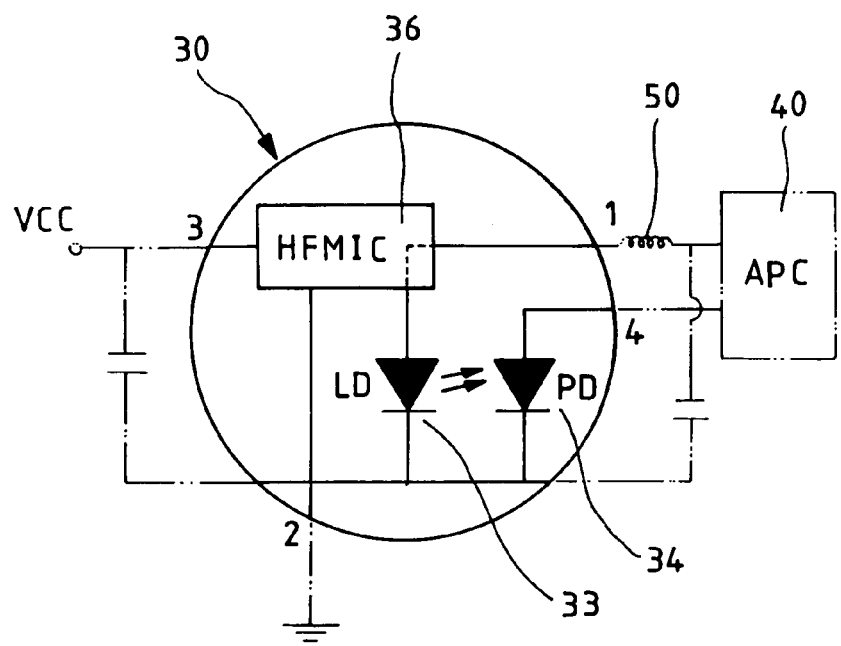
FIG. 7 is a circuit diagram of the invention.

In addition, the implementation of the invention requires four legs, i.e. the first connection leg 32a, the second connection leg 32b, the third connection leg 32c and the fourth connection leg 32d. Of this, the second connection leg 32b is an GND leg. The top is shown in FIGS. 4 and 5; it is joined to the bottom back side of the heat sink 31 so that the heat sink 31 and the mount 311 on top of it are both the GND's negative terminal power source. Please also refer to FIGS. 3 through 5; the third connection leg 32c is the positive electrical connection leg, providing the HFMIC 36 with the power needed. Meanwhile, the first connection leg 32a and the fourth connection leg 32d provide linkage with an external APC, as shown in FIG. 7. The APC 40 is joined to the first and fourth connection legs of the already built-in HFMIC's laser diode module 30. As for the APC Automatic Power Control 40, it monitors the back beam of the laser diode 33 through the photo diode 34, which creates a negative feedback loop and achieves the goal of a stable frequency output. However, the APC 40 is a circuit of a conventional laser diode module, of which is not covered in the invention's patent and no further description will be given. The feature of the invention is that the first and fourth connection legs provide linkage with an external APC 40. In addition, between the first connection leg and APC 40 there is an electrical sensor.

Figure 3:
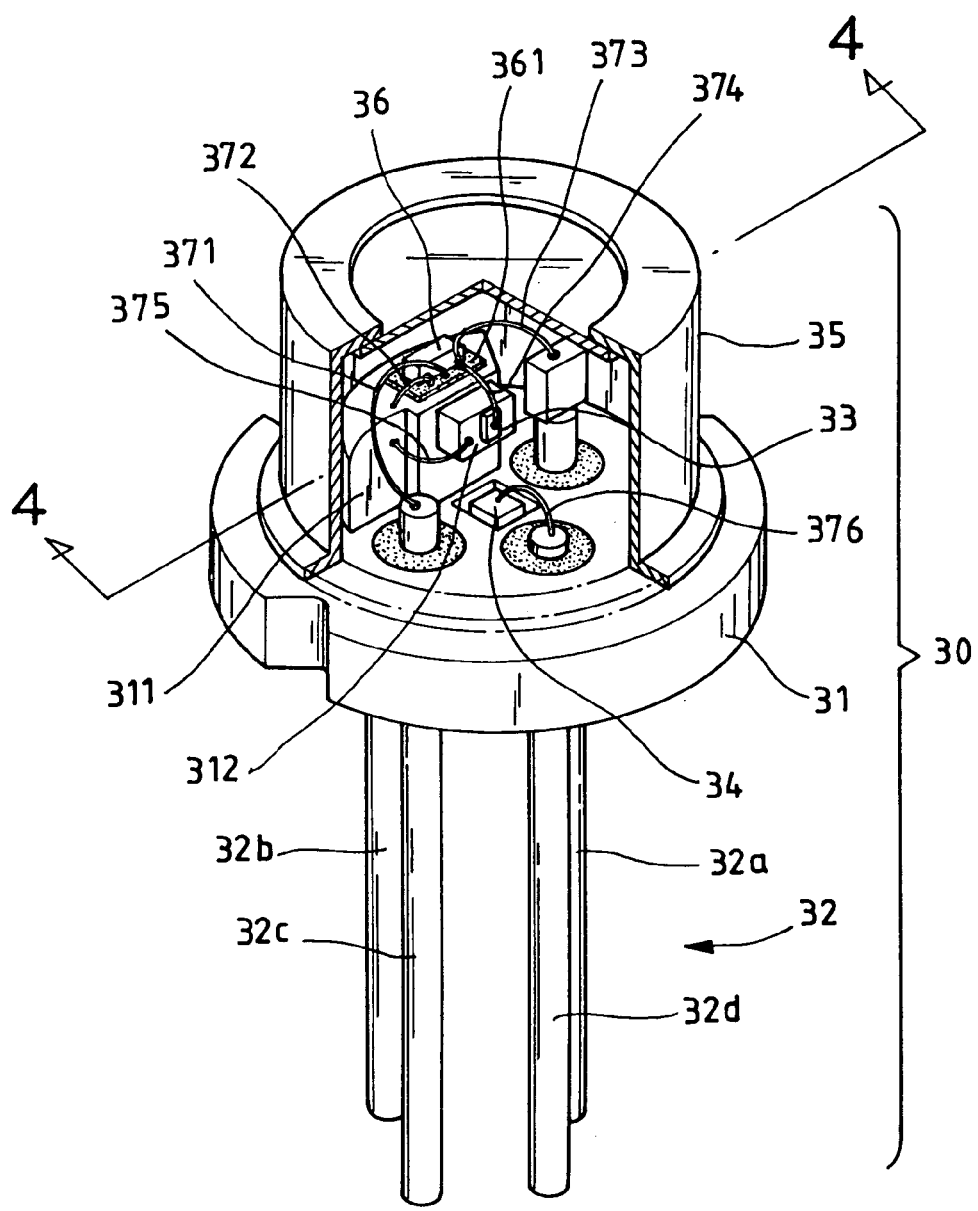
FIG. 3 is a perspective view of the present invention after packaging process.
Figure 4:
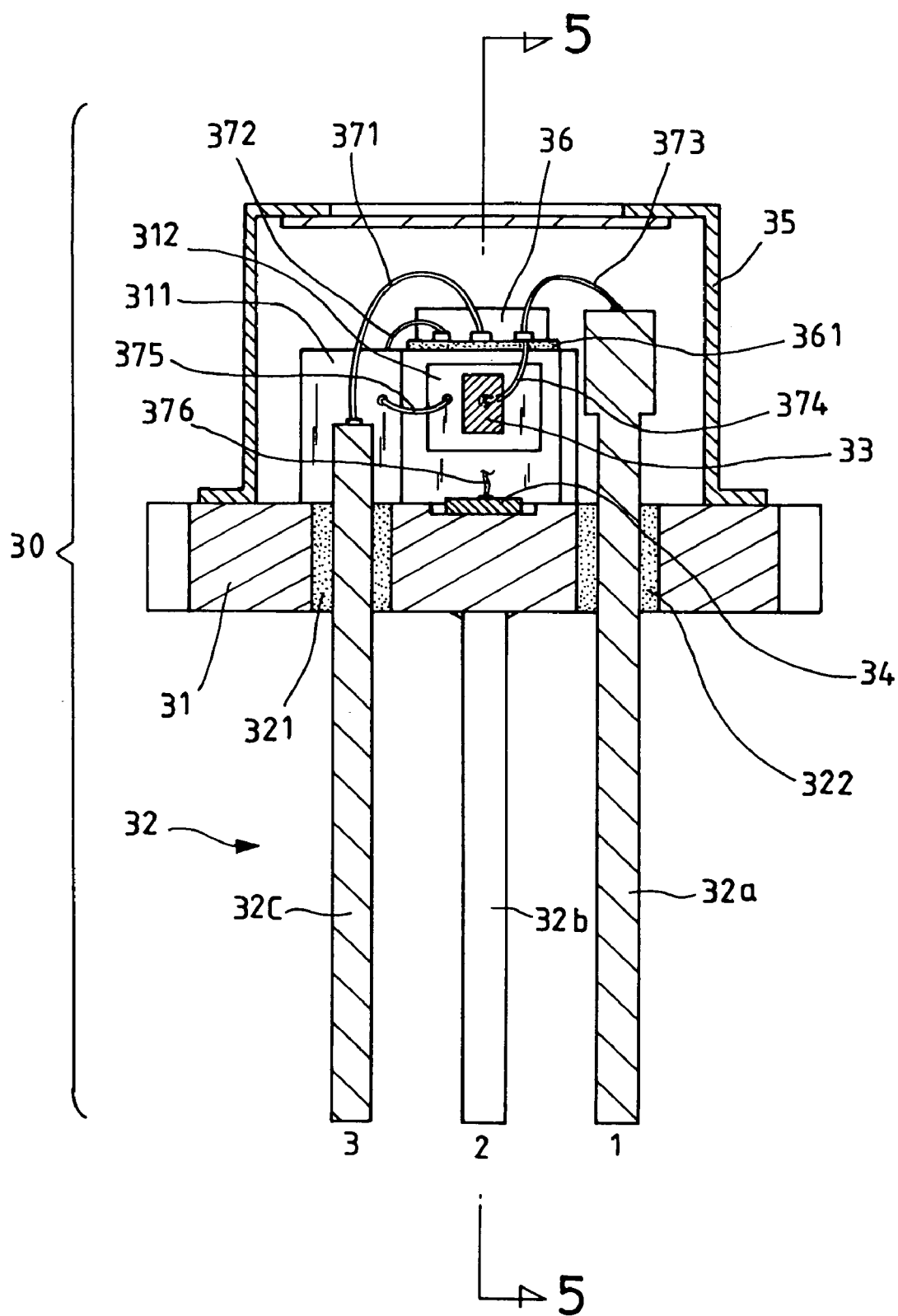
FIG. 4 is a cutaway view taken along the line 4—4 of FIG. 3.
Figure 5:
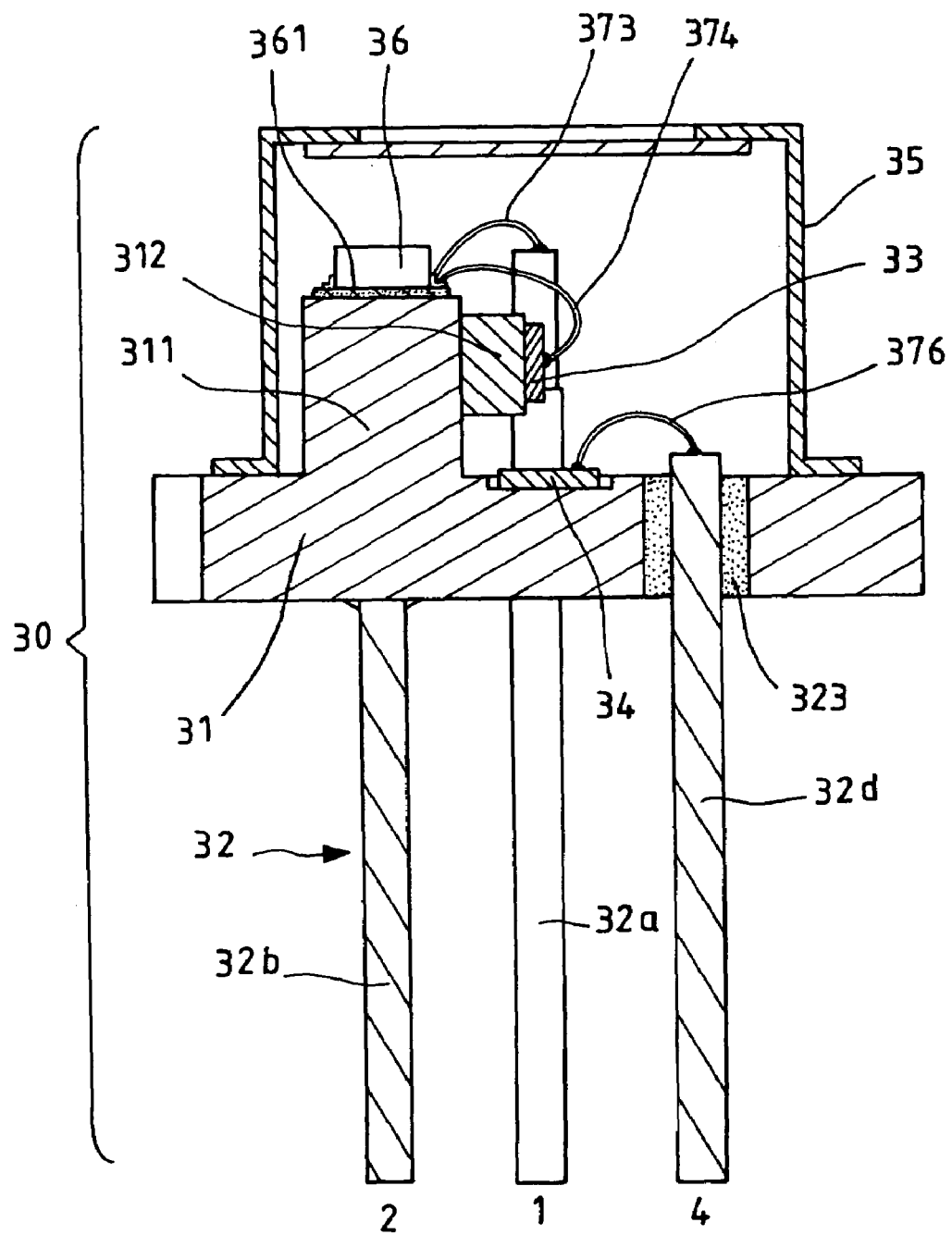
FIG. 5 is a cutaway view taken along the line 5—5 of FIG. 5.

Going back to FIGS. 2 and 3 supported by FIGS. 4 and 5, the third connection leg 32c, which serves as the positive power source, goes straight through the heat sink 31 and has an insulator 321 between it and the heat sink 31. At the top, it is joined to the HFMIC's power input end through a wire bond 371 while the HFMIC's 36 GND end is joined to the mount 311 through a second wire bond 372.

In addition, the first connection leg 32a goes through the heat sink 31 and has insulation 322 placed between it and the heat sink 31. At the top there is a third wire bond 373 that connects it with the HFMIC 36. A fourth wire bond 374 links it to the LD's 33 positive end while the LD's 33 negative end is attached onto the submount 312. The submount 312 is then linked to the mount 311 through the fifth wire bond 375.

The fourth connection leg 32d goes through the heat sink 31 and has insulation 323 placed between it and the heat sink 31. At the top there is a sixth wire bond 376 that connects it with the PD's 34 positive terminal while the PD's 34 negative terminal is attached onto the surface of the heat sink 31.

Figure 6:
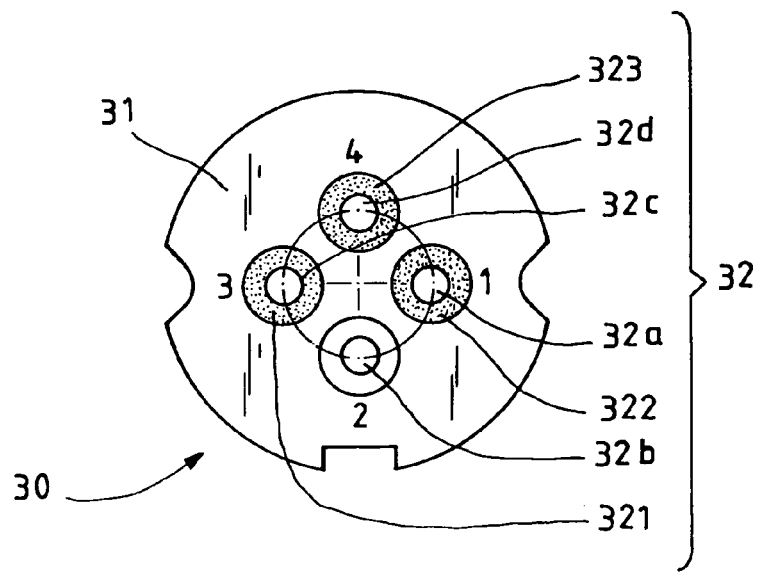
FIG. 6 is a bottom view of the invention.

Through the method mentioned above, the HFMIC 36 can utilize its existing 5.6 mm or smaller diameter sealed packaging, build-in within the metal cap 35, forming a built-in HFMIC laser diode module 30, as shown in FIG. 3. FIG. 6 shows the laser diode module 30 from the back bottom. The definition of the four new connection legs along with the electrical circuit diagram in FIG. 7 shows:

First connection leg links with the APC 50, and is the LD's 33 positive terminal power source.

Second connection leg is the HFMIC 36, laser diode 33 and PD's 34 GND negative terminal power source.

Third connection leg is the HFMIC's 36 positive terminal power source.

Fourth connection leg links with the APC 50, and is the PD's 34 positive terminal power source.

This invention's new laser diode module 30 can reduce the inconvenience of having to attach an external high-frequency electric current producing circuit board 20 when manufacturing optical pickup apparatus, and can also reduce the need for manual adjustments, thereby greatly enhancing productivity and convenience, as well as simplifying module designing. Furthermore, it can reduce the space and cost needed for product designing and also bring down EMI due to the shielding by the metal cap 35.

Figure 8:
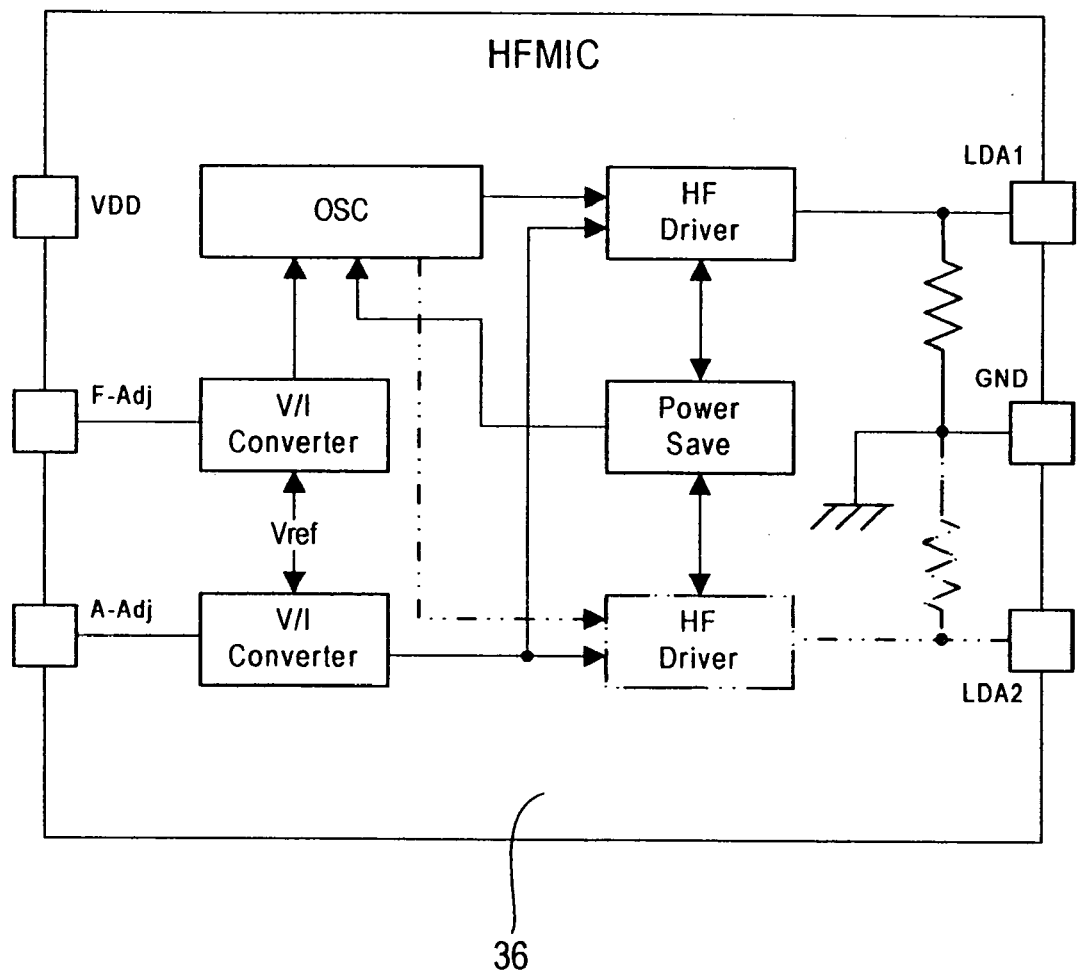
FIG. 8 is a block diagram of the high-frequency modulation IC in accordance with the invention.

As for the principle and structure of the high-frequency electric current producing circuit used to remove the reflected noise, much can be found in previous patents and technical literature and no further description will be given here. TOSHIBA has lots of research and patents in this field. The applicant has collaborated with TOSHIBA, and integrated circuited the high-frequency electric current producing circuit. FIG. 8 shows an applicable embodiment of the HFMIC, which includes a V/I converter, OSC, HF driver, and power save module. In addition, the HFMIC can build-in frequency and amplitude modulation directly into the HFMIC 36. With the advancement of IC technology, there is already great progress in the development of high-frequency electric current producing circuits. This includes controlling power consumption and enlarging the high-frequency electric current amplitude controlled by the laser diode. This also has the feature of low heat generation. Therefore, the invention places the circuit within the metal cap 35 after integrated, which helps overcome the problem of making the optical pickup apparatus smaller and lightweight. In addition, as shown by the dotted lines in FIG. 8, the HFMIC can link up with another high-frequency driver circuit, which can be used by a laser diode that has a different wave length so that it can used as an optical disk device for DVD and CD-ROM. The electrical circuit block diagram in FIG. 8 describes HFMIC's optimal implementation example. The allocation and changes to the electrical circuit is not the target of the invention, and no further description will be given. The built-in HFMIC technology used in the invention helps simplify the packaging and manufacturing, save costs, has market worthiness, and can be applied by the industry.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A laser diode module with a built-in high-frequency modulation IC, comprising:

a) a heat sink with a plurality of legs attached to the rear side thereof;
b) a mount disposed on the top of the heat sink;
c) a submount supported against the mount;
d) a laser diode chip disposed on the submount; and
e) a photo diode chip mounted on the heat sink;

whereby a circuit for producing high-frequency current and removing the reflected noise generated by the laser diode is integrated to be a high-frequency modulation IC and packaged within a metal cap, and wherein the high-frequency modulation IC creates an electric connection with connecting legs and the laser diode chip through wire boding, and the packaged laser diode module has four connection legs, two of which act as a positive and a negative terminal for supplying power to the built-in high-frequency modulation IC, and the other two are electrically connected to an external automatic power control circuit and act as the positive terminal of the laser diode chip and the photo diode chip, respectively.

2. The laser diode module with a built-in high-frequency modulation IC as recited in claim 1 wherein the high-frequency modulation IC is disposed on a mount and insulated therefrom by an insulation layer.

3. The laser diode module with a built-in high-frequency modulation IC as recited in claim 1 wherein a first leg and a fourth leg are connected to the external automatic power control circuit, and wherein a second leg act as a grounding leg having its top attached to the bottom surface of the heat sink, and wherein a third leg acts as a positive terminal for supplying power to the high-frequency modulation IC.

4. The laser diode module with a built-in high-frequency modulation IC as recited in claim 3 wherein the second leg is electrically connected to the heat sink and the mount and acts as a negative grounding terminal.

5. The laser diode module with a built-in high-frequency modulation IC as recited in claim 3 wherein the third leg protrudes above the heat sink and is insulated from the heat sink by a first insulator, and wherein the third leg is electrically connected to an power input of the high-frequency modulation IC through a first wire, and wherein the grounding terminal of the high-frequency modulation IC is electrically connected to the mount through a second wire.

6. The laser diode module with a built-in high-frequency modulation IC as recited in claim 3 wherein the first leg protrudes above the heat sink and is insulated from the heat sink by a second insulator, and wherein the top of the first leg is electrically connected to the high-frequency modulation IC through a third wire and then to a positive terminal of laser diode chip through a fourth wire, and wherein a negative terminal of the laser diode chip is stuck to the submount and then electrically connected to the mount through a fifth wire.

7. The laser diode module with a built-in high-frequency modulation IC as recited in claim 3 wherein the fourth leg protrudes above the heat sink and is insulated therefrom by a third insulator, and wherein the top of the fourth leg is electrically connected to a positive terminal of the photo diode chip through a sixth wire while a negative terminal of the photo diode chip is stuck to the surface of the heat sink.

8. The laser diode module with a built-in high-frequency modulation IC as recited in claim 3 wherein an inductance is interposed between the first leg and the external automatic power control circuit.

9. A laser diode module with a built-in high-frequency modulation IC, comprising:
a) a heat sink with a plurality of legs attached to the rear side thereof;
b) a mount disposed on the top of the heat sink;
c) a submount supported against the mount;
d) a laser diode chip disposed on the submount;
e) a photo diode chip mounted on the heat sink; and
f) a metal cap mounted above the heat sink;

wherein the improved invention is characterized by:
An insulation layer disposed on the top of the heat sink;
a circuit for producing high-frequency current and removing the reflected noise generated by the laser diode integrated to be a high-frequency modulation IC, the high-frequency modulation IC being built on the insulation layer and creating an electric connection with connecting legs and the laser diode chip through wire boding; and
a first and a second leg of the four connecting leg on the rear side of the heat sink acting as a positive and a negative terminal for supplying power to the built-in high-frequency modulation IC, and a first and a fourth leg being electrically connected to an external automatic power control circuit and acting as the positive terminal of the laser diode chip and the photo diode chip, respectively.

10. The laser diode module with a built-in high-frequency modulation IC as recited in claim 9 wherein the second leg is electrically connected to the heat sink and the mount and acts as a negative grounding terminal.

11. The laser diode module with a built-in high-frequency modulation IC as recited in claim 9 wherein the third leg protrudes above the heat sink and is insulated from the heat sink by a first insulator, and wherein the third leg is electrically connected to an power input of the high-frequency modulation IC through a first wire, and wherein the grounding terminal of the high-frequency modulation IC is electrically connected to the mount through a second wire.

12. The laser diode module with a built-in high-frequency modulation IC as recited in claim 9 wherein the first leg protrudes above the heat sink and is insulated from the heat sink by a second insulator, and wherein the top of the first leg is electrically connected to the high-frequency modulation IC through a third wire and then to a positive terminal of laser diode chip through a fourth wire, and wherein a negative terminal of the laser diode chip is stuck to the submount and then electrically connected to the mount through a fifth wire.

13. The laser diode module with a built-in high-frequency modulation IC as recited in claim 9 wherein the fourth leg protrudes above the heat sink and is insulated therefrom by a third insulator, and wherein the top of the fourth leg is electrically connected to a positive terminal of the photo diode chip through a sixth wire while a negative terminal of the photo diode chip is stuck to the surface of the heat sink.

14. The laser diode module with a built-in high-frequency modulation IC as recited in claim 9 wherein an inductance is interposed between the first leg and the external automatic power control circuit.

* * * * *